(12) United States Patent
Breidt et al.

(10) Patent No.: US 7,815,735 B2
(45) Date of Patent: Oct. 19, 2010

(54) BODY HAVING A SMOOTH DIAMOND LAYER, DEVICE AND METHOD THEREFOR

(75) Inventors: Dirk Breidt, Erkelenz (DE); Oliver Lemmer, Aachen (DE); Martin Frank, Aachen (DE)

(73) Assignee: Cemecon AG (DE)

( * ) Notice: Subject to any disclaimer, the term of this patent is extended or adjusted under 35 U.S.C. 154(b) by 1049 days.

(21) Appl. No.: 10/549,621

(22) PCT Filed: Mar. 22, 2004

(86) PCT No.: PCT/EP2004/003014

§ 371 (c)(1),
(2), (4) Date: Jun. 8, 2006

(87) PCT Pub. No.: WO2004/083484

PCT Pub. Date: Sep. 30, 2004

(65) Prior Publication Data

US 2006/0219158 A1  Oct. 5, 2006

(30) Foreign Application Priority Data

Mar. 21, 2003 (DE) .............................. 103 12 777

(51) Int. Cl.
*C30B 25/00* (2006.01)
(52) U.S. Cl. .............................. 117/93; 117/84; 117/88; 117/102; 117/105; 117/928; 117/929; 76/DIG. 12
(58) Field of Classification Search ................ 117/84, 117/88, 93, 102, 105, 928, 929; 76/DIG. 12
See application file for complete search history.

(56) References Cited

U.S. PATENT DOCUMENTS 5,505,158 A * 4/1996 Thorpe et al. ................. 117/89

5,567,522 A * 10/1996 Tanabe et al. ................ 428/408

(Continued)

OTHER PUBLICATIONS

Ali et al, "Promoting secondary nucleartion using methane modulations during diamond chemical vapor deposition to prodcue smoother, harder and better quality films", J. Material Res. vol. 18, No. 2, (Feb. 2003), p. 296-304.*

(Continued)

*Primary Examiner*—Robert M Kunemund
*Assistant Examiner*—Matthew J Song
(74) *Attorney, Agent, or Firm*—Banner & Witcoff, Ltd.

(57) ABSTRACT

The invention refers to a method and apparatus for CVD coating and to a coated body. To improve the mechanical properties of the structure and surface of the body and to make the method and apparatus as simple and cost-effective as possible, it is suggested in the method, in which a layer is deposited on a substrate in a carbon-containing gas atmosphere:

that the process parameters be varied during the coating period in such a way that during the coating period a first operating mode and a second operating mode are repeatedly alternated, wherein in the first operating mode a higher carbon oversaturation of the gas atmosphere occurs near the substrate, and in the second operating mode a lower carbon oversaturation of the gas atmosphere occurs near the substrate.

In this way, a body can be produced with a substrate and at least one layer deposited on the surface of the substrate, wherein the layer consists of nano-crystalline diamond.

7 Claims, 5 Drawing Sheets

U.S. PATENT DOCUMENTS 5,852,341 A * 12/1998 Phillips et al. .............. 313/336
5,989,511 A * 11/1999 Gruen et al. ................ 423/446
6,268,045 B1 * 7/2001 Leyendecker et al. ....... 428/216

OTHER PUBLICATIONS

Chen et al, "Growth of highly transparent nanocrystalline diamond films and a spectroscopic study of the growth", Journal of applied physics, vol. 89, No. 1, Jan. 2001, p. 753-759.*

* cited by examiner

3 μm

BODY HAVING A SMOOTH DIAMOND LAYER, DEVICE AND METHOD THEREFOR

This application is a U.S. National Stage application of co-pending PCT application PCT/EP2004/003014 filed Mar. 22, 2004, which claims the priority of German Patent Application No. 103 12 777.1, filed Mar. 21, 2003. These applications are incorporated herein by reference in their entireties.

The present invention relates to a method and apparatus for CVD coating and a coated body.

A well-known approach for the production of high-performance tools is providing bodies of a substrate material with a surface coating. In particular, cemented carbide tools (such as drill or mill bits) are known, wherein at least the area of the cutting edges is coated with a diamond layer. For depositing surface coatings, CVD methods and corresponding apparatus are known.

WO 98/35071 of the present applicant discloses a CVD method and an apparatus used therefor (CVD coating system). In a vacuum chamber of the coating system a hot filament CVD process is carried out in which, as a process gas, a mixture of $H_2$ and CH4 is put on a heating filament where it thermally disintegrates. At substrate temperatures of between 700° C. and 1000° C., a diamond layer having a thickness of 15 μm, for example, is created on a cemented carbide or cermet substrate.

WO 00/60137 of the present applicant also discloses a CVD method for producing diamond layers by means of a hot filament process. Two layers are deposited on a tool, the second of which, the outer layer, has a higher thermal coefficient of expansion. This second layer can be of a nano-crystalline diamond. The method described for the production of a nano-crystalline diamond layer has turned out, however, to be very cumbersome.

Traditional polycrystalline CVD diamond layers, because of their structure, have a certain surface roughness. Since with the usual substrates, the initial nuclei are randomly oriented while the speed of growth depends on the orientation of the crystallographic layers of the crystallites, the crystals oriented in a favourable way with respect to the surface overgrow the others, so that the layer surface is formed by less and less crystallites as the process wears on. This is shown in FIG. 3 by way of example. This form of layer growth has been described in "Evolutionary selection, a principle governing growth orientation in vapour deposited layers", by A. Drift, in Philips Research Reports 22, 1967, p. 267-287. The roughness caused by this process can be undesirable, in particular for the use of diamond coatings on machining tools, cutting blades and hard wearing components. The roughness cannot be eliminated by the use of very high nucleus densities at the beginning of the coating process. Because, also in this case, the layers become rougher as they become thicker.

Subsequent mechanical smoothing of the conventional micro-crystalline or cauliflower diamond layers is impractical in most cases because of their great hardness. Nevertheless to create smooth surfaces of CVD diamond, methods for subsequent smoothing by means of thermo-chemical methods and laser erosion have been suggested. However, these methods are very complex and costly. This applies in particular to more complex geometries, such as with end mills.

Corresponding methods are described, for example, by Jin, S., Graebner, J.E.; Tiefel, T.H.; Kammlott, G.W. in "Thinning and patterning of CVD diamond films by diffusional reaction" in Diamond and Related Materials, 2 (1993) 1038-1042 and Bögli, U.; Blatter, A.; Pimenov, S.M.; Smolin, A.A.; Konov; V.I. in "Smoothing of diamond films with ArF laser" in Diamond and Related Materials 1(1992) 782-788.

Approaches have also been published which achieve surface smoothing by preferring certain crystal forms (so-called alpha parameters) and their orientation with respect to the substrate (texture) by selecting the coating parameters. Corresponding methods are described by Wild, P.; Koidl, W.; Müller-Sebert, W.; Walcher, H.; Samlenski, R.; Brenn, R. in "Chemical vapour deposition and characterization of smooth {100}-faceted diamond films" in Diamond and Related Materials, 2(1993), 158-168. These methods have several drawbacks, however. For example, the choice of coating parameters is very limited. In particular, the temperature and carbon content in the gas atmosphere have to be adapted to the growth conditions of the desired crystal form and texture. These conditions are unfavourable, however, for the stability of many substrates. This is particularly true for cemented carbide which are the preferred substrate for the CVD diamond coatings of tools and components. In some applications, there are only very small processing windows in the temperature and carbon content of the processing atmosphere due to the carbon solubility in the diffusion of the binder. Nor can the film thickness be freely selected, since a certain minimum thickness has to be reached in order to ensure the overgrowing of the undesirable crystals.

It is an object of the present invention to provide a coated body and a method and apparatus for the production thereof, wherein the structure and surface of the body is formed in such a way that it has improved mechanical properties, and the method and apparatus are simple and do not involve high costs.

With respect to the method and the apparatus, the object is achieved by varying the processing parameters during the coating period. This is done in such a way that during the coating period, two operating modes are repeatedly alternated.

In a first operating mode, the parameters are selected such that a higher carbon over-saturation of the gas atmosphere occurs near the substrate, whereas, in the second operating mode, the parameters are adjusted such that, compared with the first mode, a lower carbon over-saturation occurs in the gas atmosphere near the substrate. The method is therefore based on a cyclic increase and decrease of the over-saturation of the process gas with carbon.

The apparatus according to the present invention provides a corresponding automatic control of the process parameters during the coating duration.

The method and apparatus according to the present invention allow fine crystalline to nano-crystalline CVD diamond films to be produced by a suitable selection of the alternations between the operating modes, which have a homogeneous surface and structure and an increased fracture toughness. This ensures that, compared with the subsequent smoothing methods, a smooth surface is achieved using simple means, wherein the smoothing in-situ is carried out by the growth conditions in the process. This is how a smooth surface can also be achieved with complex geometries.

The control of the over-saturation can be achieved by varying the substrate temperature and/or varying the composition of the introduced gas. Preferably, the effective gas atmosphere, i.e. its carbon content involved in the reaction, is varied in a controlled way.

The diamond layer is deposited on a substrate, for example of a cemented carbide (preferably WC—Co) or of silicon. The film can be deposited either directly on the substrate surface, or intermediate layers can be provided.

The layers can be fine crystalline (single crystals having a size of 0.1-2 μm) or preferably nano-crystalline (single crystals having a size of 1-100 nm). Preferably, the layer is essentially untexturized and consists of individual, unsorted crystallites of a small size.

The layers preferably have very little surface roughness. The mean roughness depth Rz measured according to DIN is preferably less than 2 µm, more preferably less than 1 µm. In contrast to the previously known layers, the surface roughness does not increase with growing layer thicknesses, as long as no impurities (such as dust) are introduced.

Preferably it is even possible for the surface roughness to be reduced by the coating, i.e. rough substrates are even smoothed. Thus roughnesses of the substrate can be compensated as shown in FIGS. 7 and 8 (levelling effect). The value of the surface roughness Rz of the layer will be smaller than the value of the surface roughness Rz of the substrate surface. The corresponding values can be estimated from fracture or section images, as shown in FIG. 7.

The levelling can also increase as the layer thickness is increased. For example, the value Rz can decrease by 0.05 µm for each layer increase of 1 µm. With a layer of 10 µm, the Rz value can thus be decreased by at least 0.5 µm. On the outside, it is possible to achieve a residual roughness typically in the range of Rz=0.7 µm, with industrial cemented carbide surfaces.

With films on highly polished silicon wafers, roughnesses of Rz<0.1 µm are possible, in particular when pre-nucleation and clean room conditions are additionally provided during production.

The layer gets smoother as a renewed renucleation is initiated more often. Preferably, there are at least 4 alternations between operating modes, i.e. each operating mode is applied at least twice, per 1 µm of layer growth. The preferred nano-crystalline layers, i.e. with crystals of 100 nm or less, are created at 20 alternations or more per 1 µm layer growth. It is particularly preferred when the number of alternations per 1 µm layer is considerably higher, e.g. at least 200 alternations, or even more than 500 alternations. As the frequency is increased, ever finer structures are produced. Layers with small, columnar crystals, even as small as nano-crystalline structures can thus be produced. The rapid repetition of renucleation steps can be selected such that only short-term variations, preferably symmetrical, are created around the stability range of the process.

The duration of the application of the operating modes is selected according to the desired film. Durations of at least 2 seconds, preferably of at least 10 seconds, are suggested. As a maximum, it is suggested that each operating mode not last for more than 500 seconds, preferably less than 50 seconds.

The duration with which the alternation of the first and second operating mode is applied is preferably selected such that the durations are in the same order of magnitude. The quotient of the durations is preferably between 0.1 and 10, particularly preferably between 0.5 and 2. Preferably the durations can also be the same.

Various parameters are considered for the alternation between the operating modes, which can be changed at the alternation. An alternating increase and decrease in the carbon carrier gas content (such as methane) is possible in the hydrogen atmosphere preferred with CVD diamond processes. A decrease/increase of the process gas temperature is also possible, wherein in the first operating mode, a lower temperature causes the gas to cool near the substrate surface and therefore also leads to a carbon over-saturation. The various operating modes can also be created, however, by influencing the effective carbon content. It is preferred for the volume content of the carbon carrier gas to be constantly increased above the usual value, and the alternation between high and low over-saturation is controlled by a cyclic addition of another reactive gas, e.g. an oxygen-containing gas. The reaction with the carbon leads to stable compounds, such as carbon oxides, reducing the carbon content available to growth, i.e. the effective carbon content is thus changed. Another approach would involve having a different nitrogen content in the coating atmosphere in the first and second operating modes. Combinations of the approaches mentioned are, of course, also possible.

With the suggested method and the apparatus according to the present invention, CVD coating is preferably carried out by the hot filament process, i.e. the introduced gases are thermally disintegrated at the heating filaments. It is preferred that the method be carried out in a hydrogen atmosphere with a percentage of carbon containing gases.

With respect to the coated body, the object is achieved by the film deposited on the substrate being a nano-crystalline diamond.

This leads to the surface of the film being particularly smooth and excellent for use as a tool, in particular as a machining tool.

Preferably, the surface roughness Rz is less than 2 µm, in particular preferably less than 1 µm. As mentioned above it is also preferred for the surface roughness of the film to be less than that of the substrate surface (levelling effect).

According to one embodiment, the diamond layer consists of unordered, untexturized crystals of a size between 5 and 100 nm.

It is possible for the finished body to comprise further layers other than the substrate and the nano-crystalline diamond layer. These may be intermediate layers (between the substrate and the nano-crystalline diamond layer). But the nano-crystalline diamond layer can also be one of a plurality of layers of a multi-layer coating.

Embodiments of the present invention will be described in more detail in the following with reference to the accompanying drawings, in which.

The invention is based on the knowledge that the methods of the prior art to achieve a smooth surface only influence the surface and the layers keep their columnar structure.

It has been found that brittle diamond, due to its great hardness, can break both along the grain boundaries and in inter-crystalline fashion along the single crystals extending to the substrate surface. The tear therefore directly reaches the interface. In combination with layer stresses, in particular arising during cooling due to differences in thermal expansion coefficients between the substrate and the coating, this leads to the well-known quick failure of layer adhesion during cooling or under mechanical stress.

It has been found that texturized layers with a preferred crystal orientation can be split in inter-crystalline fashion with particular ease, when shearing forces occur in the {111} splitting planes of the diamond, which with complex force conditions, e.g. during machining are almost always present in one place. These layers naturally consist of relatively large crystals making the production of sharp cutting edges or fine structures difficult, since the crystals are larger than the radius of the cutting edge or the structure.

Figure 9:
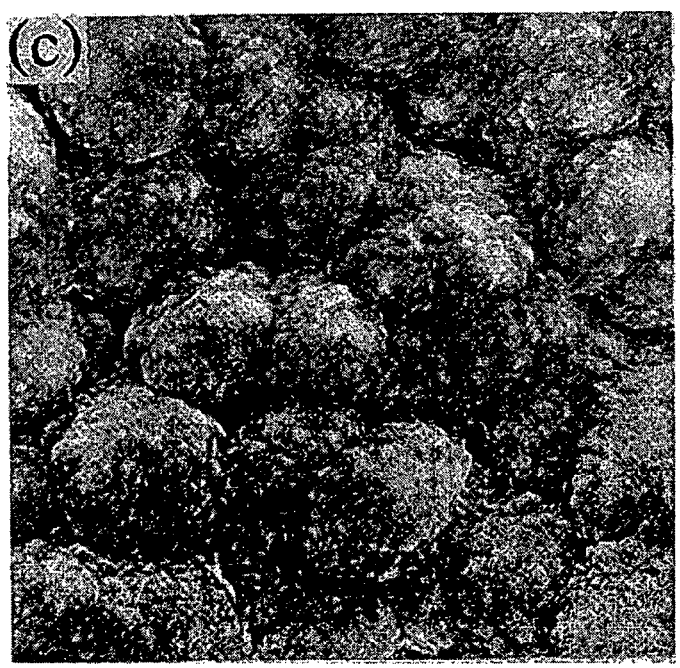
FIG. 9 is a scanning electron microscope image of a plan view of a cauliflower diamond layer (from Chi-Fu Chen et al., in Diamond and Related Materials 2 (1993) 732-736).

Diamond layers are known which have a so-called ballas or cauliflower structure (FIG. 9). In the broadest sense, these diamond layers also have diamond crystals down to the nanometer range. In contrast to the layers according to the present invention, however, they have an inhomogeneous, also rod-like structure which when viewed from the outside, gives the impression of rough cauliflower-like surfaces. The coating according to the present invention, however, is a homogeneous, fine to nano-crystalline diamond layer in which the cauliflower structures are substantially reduced or, preferably, wholly eliminated.

It is here suggested that smooth layers be created by varying the processing parameters during the coating period in such a way that a first operating mode is repeatedly alternated with a second operating mode, wherein in the first operating mode, a higher carbon over-saturation of the gas atmosphere occurs near the substrate and, in the second operating mode, a corresponding lower carbon over-saturation of the gas atmosphere occurs near the substrate.

Figure 1:
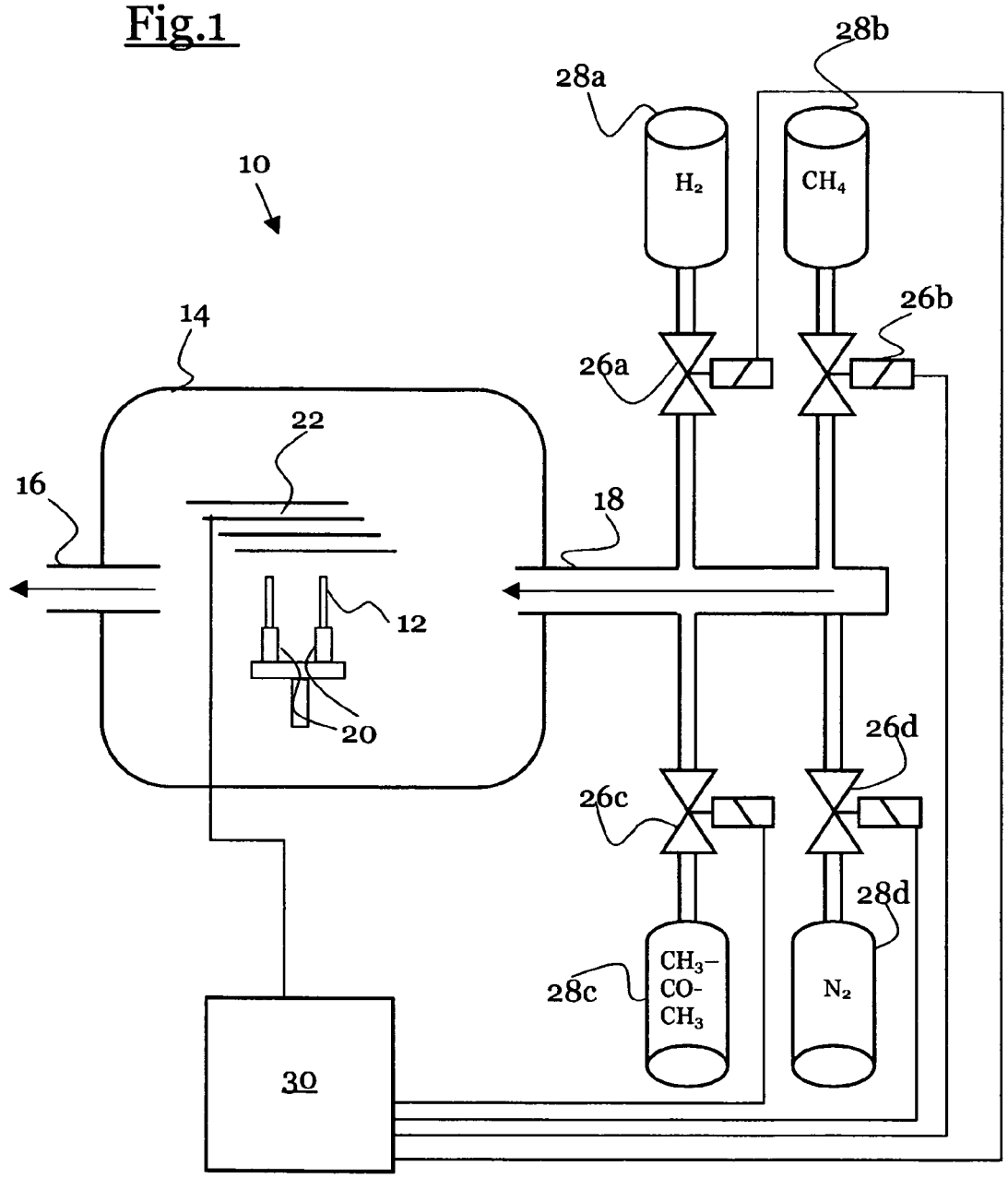
FIG. 1 is a schematic view of a coating apparatus.

To illustrate the conditions, FIG. 1 shows schematically a CVD coating system 10 for coating substrates 12 (drill bits in the present example). The system 10 comprises a vacuum chamber 14 with evacuating means 16 and at least one gas inlet 18. Through the gas inlet 18, a process gas is introduced. The example shown is a hot-filament system. A plane of heating filaments 22 is positioned above the substrates 12 (arranged in substrate supports 20). The process gas is thermally disintegrated at these filaments. Components of the process gas are deposited on the surface of the substrate as a layer. When carbon-containing gases are introduced in the process gas (e.g. $CH_4$ content) the deposition of a diamond layer can be achieved.

Corresponding systems and CVD coating methods are known to the person skilled in the art and are therefore not described here in any more detail. Parameters for this are indicated for example in WO 98/35071 and WO 00/60137. Further details also with respect to methods other than the hot filament method can be derived for example from the dissertation by Roland Franz Brunsteiner "Untersuchung der Diamantabscheidung mit den Methoden Hot Filament, Acetylenflamme und DC-Glimmentladung" ("Study of diamond deposition with the methods hot filament, acetylene flame, and DC glow discharge") Dissertation 1993 at the Institut für chemische Technologie anorganischer Stoffe of the TU Vienna, Austria.

The parameters to be adjusted with the system 10 shown by way of example are in particular the pressure, the amount and the composition of the gas flow, the filament temperature and the position of the substrates.

From these, the processing temperature, i.e. the gas temperature near the substrates, can be derived as an essential parameter. Because of the substrates' high thermal capacity in comparison with the process gas, the process temperature is also influenced by them. In the practical examples it is measured by means of a Ni—CrNi sheathed thermocouple element having a stainless steel sheath with a 3 mm diameter. In the usual coating volume, the thermometer is at a distance of about 1 cm from the substrates of interest.

In the system schematically shown in FIG. 1, the amount and composition of the process gas is controlled via controllable input ports 26a, 26b, 26c, 26d. From gas reservoirs, schematically shown at 28a, 28b, 28c, 28d, the various components of interest of the process gas (hydrogen, methane, optionally also acetone and nitrogen, the functions of which see below) are mixed at the desired amount and composition.

As shown in FIG. 1, the system 10 has a central control unit 30. It controls the input ports 26a, 26b, 26c, 26d and also controls the heating power of the filaments 22.

Figure 4:
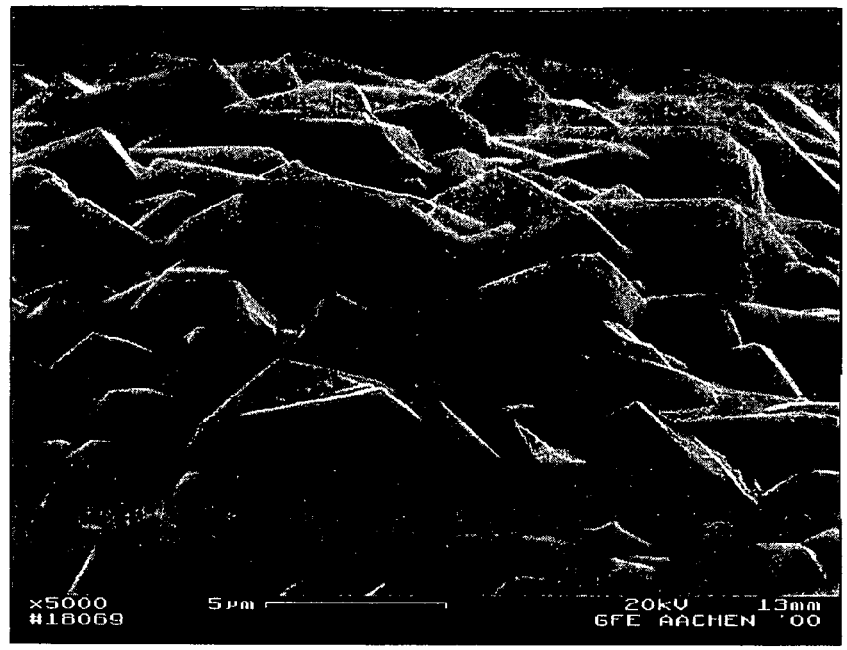
FIG. 4 is a scanning electron microscope image of the surface of a conventional diamond layer.
Figure 5:
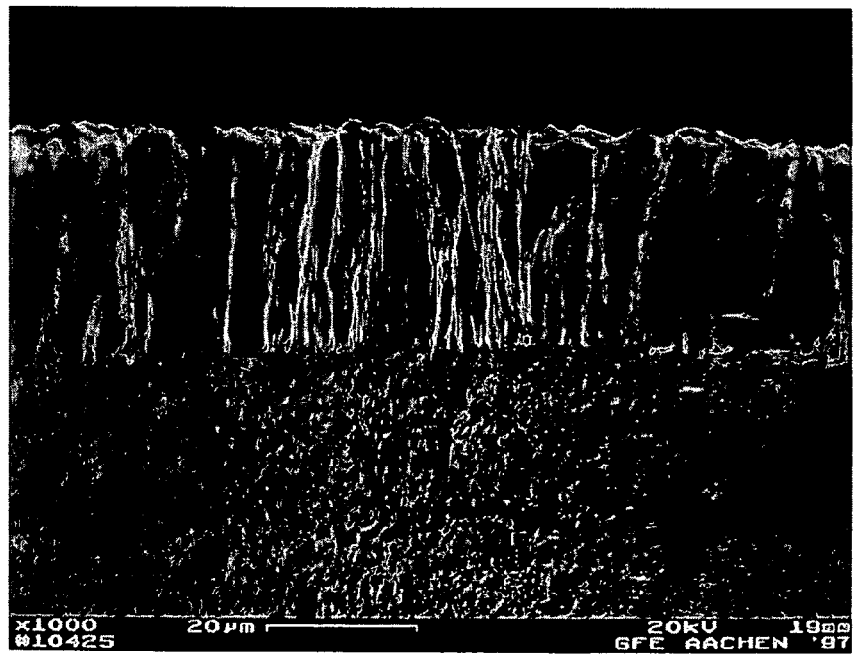
FIG. 5 is a scanning electron microscope image of a fracture of a conventional diamond layer.

The gas atmosphere used for coating is always over-saturated near the substrate so that a deposition of the carbon occurs on the substrate thus resulting in layer growth. The person skilled in the art has knowledge about the parameters for the creation of a suitably over-saturated gas atmosphere in which conventional diamond layers (FIG. 4, FIG. 5) are deposited. In the present invention, a continuous variation of the parameters is suggested so that there is a continuous alternation between higher and lower over-saturations of the gas atmosphere near the substrate. In the present description, the high over-saturation is also referred to as "relative over-saturation"(first operation mode) and the lower over-saturation as "relative under-saturation" (second operating mode).

Cf. Sommer, M.; Smith, F.W. "Activity of tungsten and rhenium filaments in $CH_4/H_2$ and $C_2H_2/H_2$ mixtures: Importance for diamond CVD" in J. Mater. Res. Vol. 5, No. 11, Nov. 1990, pp. 2433 and Sommer, M.; Smith, F.W. Proc. $2^{nd}$ ICNDST, Washington D.C. (1990), 433-8.

A higher over-saturation leads to the condensation of solid carbon phases. This leads to the preferred formation of solid carbon nuclei on the substrate surface or the growing layer.

Figure 2:
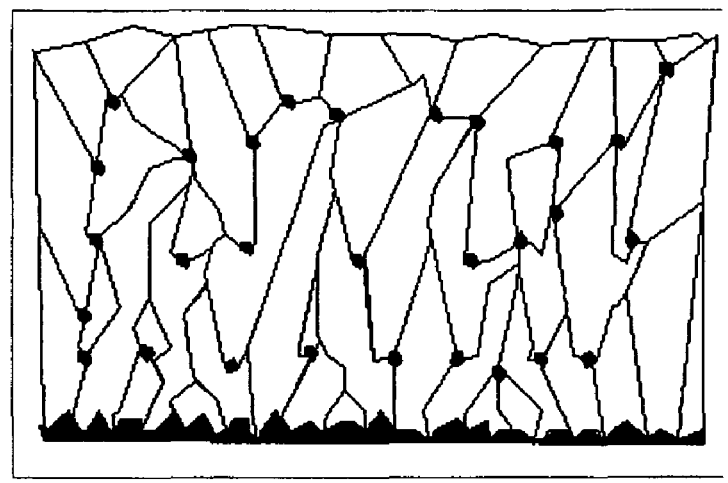
FIG. 2 is a schematic view of a cross section of a nano-crystalline diamond layer (crystal size out of scale)
Figure 3:
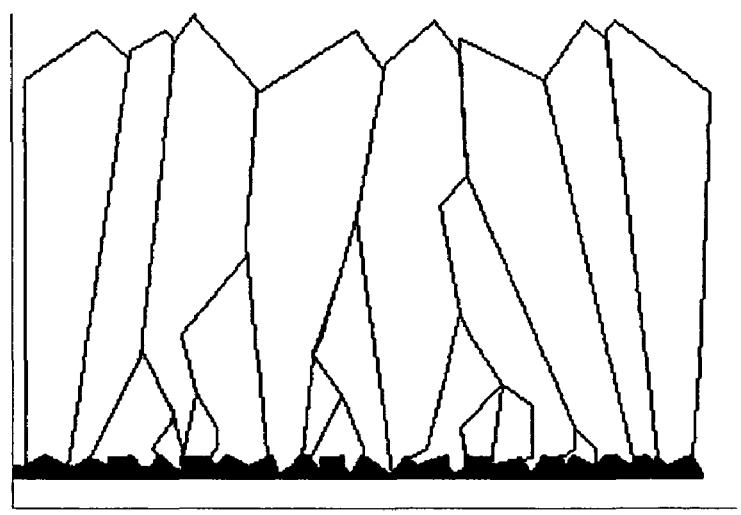
FIG. 3 is a schematic view of a cross section of a conventional diamond layer (crystal size out of scale)

As a result of the continuous alternation between the operating modes, new nucleation centres are continuously created and the growth of new crystals is favoured (renucleation). A high over-saturation of the gas atmosphere has a favourable effect on nucleation. If the over-saturation is maintained for too long, non-diamond-bound (sp2) or amorphous carbon is increasingly formed. A low over-saturation, on the other hand, favours diamond growth with respect to the other phases. This is schematically shown in FIG. 2 wherein, for reasons of clarity, the single crystallites are shown larger than in the preferred embodiment.

By a cyclic variation of the carbon over-saturation of the atmosphere a uniform renucleation can be achieved which does not favour the roughness peaks, but even acts in a levelling manner. Particularly smooth layers are obtained if the renucleation preferably occurs in the roughness valleys.

Preferably the process "oscillates" around a mean state previously used for the deposition of diamond coatings. The change of this "mean" processing adjustment to the one and to the other operating mode can comprise changing one or more of the parameters.

Mechanism of Renucleation

The effect utilized in the method described here, in the view of the inventors, is based on the fact that by a short-term high over-saturation of the gas atmosphere with carbon, smallest particles or clusters of carbon precipitate on the substrate surface which act as nuclei for new crystals and occupy the growth sites on the old crystals. Incidentally, in the methods described here the conditions can be selected in such a way that the condensation to clusters preferably occurs in the valleys of the roughness. It is possible that the surface temperature is a bit lower in these places due to the higher material density and/or due to the small effective diameter for hydrogen recombination, which leads to a preferred condensation of clusters.

These clusters need not necessarily be diamond-bound or, in other words, sp3-bound. They are probably only a few C atoms with unsaturated bindings. An over-saturation for too long a time has to be avoided in any case, since otherwise conditions predominate which lead to the formation of inhomogeneous, rough or not dominantly diamond-bound carbon layers.

Since the precise carbon contents of the process gas depends on the method and partially also on the configuration of the reactor used, it is impossible to cite generally applicable parameters. Normally each coating system has a range in which a diamond layer can be deposited. With hot filament methods this range is at about 0.3 to 5% methane content. The percentages designate the volume contents of the gas in the chamber. They result from the adjusted flow-through rates under normal conditions (ideal gas).

At the extremes of this range, sometimes only the above-mentioned cauliflower diamonds are obtained, or the rate and nucleation densities remain low. A more interesting region is therefore between 0.5 and 2.5%.

The suggested method provides for the carbon (e.g. methane) content to be increased temporarily and as a compensation to be decreased over a certain other period time, i.e. to ensure a relative over- or under-saturation of the gas atmosphere in cyclic fashion. It has been shown that smoother, more homogeneous and finer crystalline layers can be obtained in this way than with constant processing parameters.

The size of the diamond structures is decreased as the number of alternations is reduced. Due to the mixing processes by diffusion and flow in the gas atmosphere, there is a lower limit for the crystal sizes at about 10 nm also for larger size systems (300 liters volume). Because of these mixing processes, there are, of course, also no sharply defined crystal limits. Actually, there is no strict upper limit for the cycle time. There should be, however, several cycles per each μm of growth in order to achieve smoother structures. Otherwise, the desired fine grain structure is not achieved, but a multilayer is created, e.g. of conventional diamond and cauliflower structure. With hot filament methods, there is also a risk, that with excessive cycle times the remaining parameters drift off due to changes in the carbon content of the filaments. This is why the process must be adjusted by the person skilled in the art in such a way that this does not happen.

The desired levelling effect is achieved by suitably selecting the processing parameters in such a way that the nuclei are preferably formed in recesses of the substrate or the layer. The parameters to be adjusted for this are on the one hand the effective carbon content in the process gas in the two operating modes and on the other hand each duration of the application of the two operating modes.

To produce the desired layer, the person skilled in the art first uses the parameters for the well-known deposition of conventional, poly-crystalline diamond layers (such as corresponding to FIG. 4) and adjusts the parameters of the system used, such as pressure, carbon content, oxygen content, nitrogen content, gas flow, temperature etc. in a suitable fashion.

Based on this "stability region" he or she then determines, as described above by way of example, operating conditions with relative over- and under-saturation. Layers are then deposited by alternating between the operating modes and evaluated with respect to the morphology of the layer, as can be seen in the cross sections in analogy to FIGS. 4 to 7.

If the layer produced tends too much toward a cauliflower structure (FIG. 9), the carbon over-saturation can be reduced or the duration of the application of the first operating mode can be shortened. Too high or too long an over-saturation also leads to a precipitate of carbon layers and soot on other parts of the system.

If the layer tends too much towards the conventional polycrystalline structure (FIG. 4), the over-saturation can be increased or the duration of the application of the first operating mode can be lengthened. This applies in particular when large crystals are formed, which are spaced far apart, and when the layer is no longer continuous.

If the relative under-saturation is chosen to be too strong or is applied for too long a time, this leads to a decrease in the rate of layer growth.

In the middle between the above-mentioned layer morphologies there is a range in which particularly smooth layers are formed with the above levelling effect. As the cycle times are shortened, ever finer crystals and smoother surfaces can be produced. However, if times become too short, depending on the substrate size and structure, due to thermal inertia and a too slow segregation of the two gas atmospheres, layers are grown which approximately correspond to the time-weighted mean of the adjusted parameters. In these cases, the differences in temperature and gas composition should be further enhanced between the operating modes. If the times become too long, multilayer-structured films are formed.

In some cases the addition of oxygen is advantageous, e.g. with respect to the layer rate and the purity of the diamond. Generally it has been found, however, that the only parameter critical for the formation of a diamond layer is the effective carbon content which results when the volume density of the oxygen atoms is subtracted from the volume density of the carbon atoms. The reason for this is probably that under the conditions of diamond coating the thermodynamically stable carbon-monoxide (CO) is not involved in diamond formation. The cited work by Brunnsteiner shows that the addition of CO as the sole carbon carrier gas does not lead to the formation of films. The above-mentioned arguments also apply if the carbon content is replaced by the effective carbon content.

The effective carbon concentration is obtained if the atomic concentration of oxygen in the process gas is subtracted from the atomic concentration of carbon. A gas mixture of, for example, 1% acetone ($CH_3$—CO—$CH_3$) with 0.2% molecular oxygen ($O_2$) thus has an effective carbon concentration of 1.6% (calculation: 1% ·(3−1)−0.2%·2=1.6%).

Oxygen thus has an effect towards a relative under-saturation of the coating atmosphere. The addition of nitrogen, on the other hand, has an effect towards a relative over-saturation. A combination of the measures is, of course, also possible.

The parameter ranges can be roughly summarized in the following formula:

$$C_u < (C_1 * T_1 + C_2 * T_2)/(T_1 + T_2) < C_o$$

wherein $C_u$ is the lower limit of the effective carbon concentration in the system at which a diamond layer still grows, $C_o$ is the upper limit of the effective carbon concentration in the system at which a diamond layer still grows, $C_1$ is the effective carbon concentration in the first operating mode (relative over-saturation), $C_2$ is the effective carbon concentration in the second operating mode (relative under-saturation), $T_1$ is the time of application of the first operating mode, and $T_2$ is the time of application of the second operating mode.

The change of the gas flows does not have to be abrupt, but random concentration differences can also lead to the described improvements of the layer. Thus generally:

$$C_u < \int_o^T C(t)dt < C_o$$

wherein T is the cycle time and C(t) is the time dependent non-constant effective carbon concentration.

Conventional Process

An example of a hot filament process is shown in the following. The volume percentages in the process gas are usually controlled by means of the relative gas flows. The remaining gas is hydrogen.

In the system used (cf e.g. FIG. 1) there is growth of a diamond layer on the substrate at a growth rate of 0.25 μm/h:

| Parameter | Unit | Value |
| --- | --- | --- |
| pressure | hPa | 20 |
| overall flow per litre chamber volume | mln/min/l | 25 |
| process temperature | ° C. | 850 |
| filament temperature | ° C. | 2000 |
| distance substrate - hot filament | mm | 10 |
| $CH_4$ content in the process gas | Vol. % | 1 |

To produce fine to nano-crystalline diamond layers, the coating is carried out in such a way that the adjusted parameters are not held constant over the duration of coating, but are cyclically changed.

First Embodiment

In a first embodiment of the present method, the processing temperature is no longer maintained constant, but cyclically changed with 3 changes per minute as follows.

| Operating mode 1 (high over-saturation): | | |
| --- | --- | --- |
| process temperature | ° C. | 700 |
| duration per operating mode | s | 20 |
| Operating mode 2 (lower over-saturation): | | |
| process temperature | ° C. | 900 |
| duration per operating mode | s | 20 |
| period duration | s | 40 |

If the oscillations exceed 1100° C. or fall below 650° C., the resulting layers are no longer homogeneous or are no longer predominantly of diamond. Due to the thermal inertia of the substrates which also contribute to determining the process temperature near them, the pulse times can hardly get any shorter than 2 seconds in order to achieve an improvement.

Figure 6:
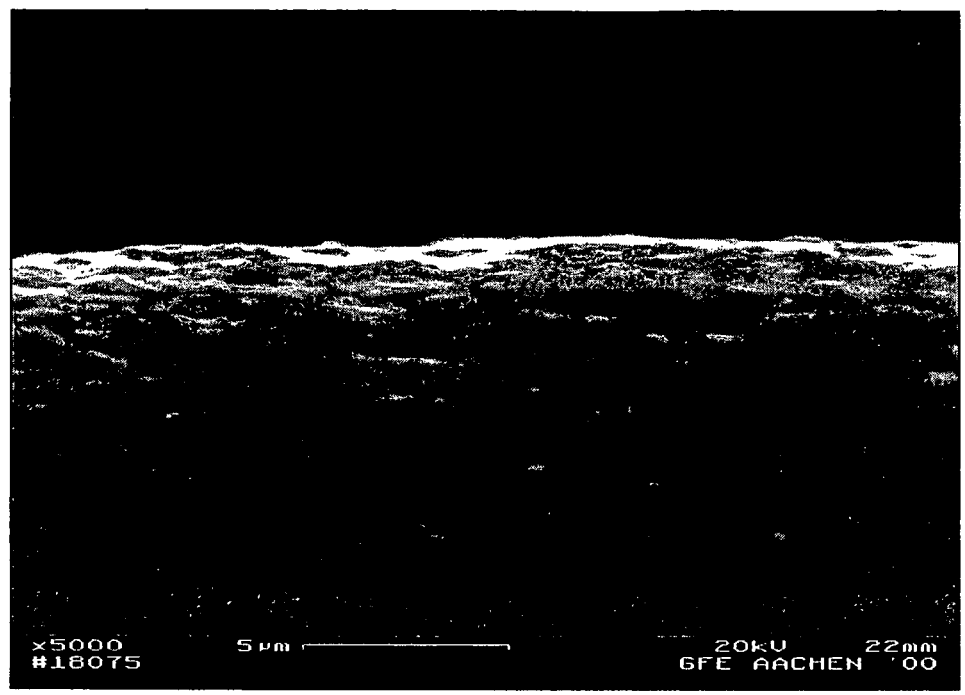
FIG. 6 is a scanning electron microscope image of the surface of a nano-crystalline diamond layer.
Figure 7:
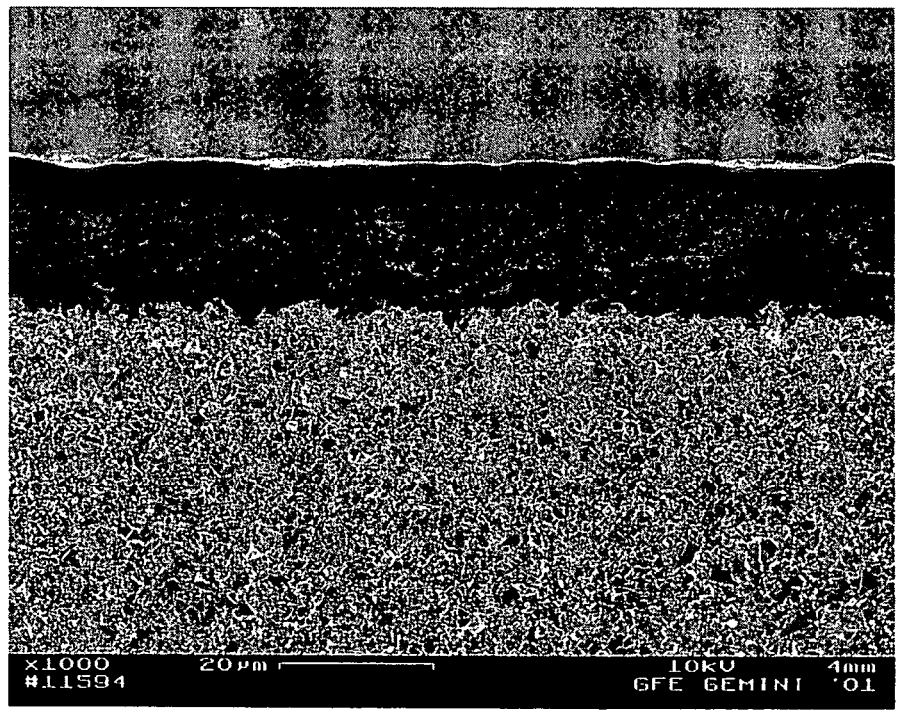
FIG. 7 is a scanning electron microscope image of a fracture of a nano-crystalline diamond layer on a hard metal substrate.

If the operating modes are continuously alternated, a layer rate of also about 0.25 μm/h is obtained. During the layer growth of 1 μm (duration 4 h), there are more than 700 alternations between the operating modes. The deposited diamond layer is nano-crystalline (FIGS. 6, 7).

Second embodiment

In a second embodiment of the present method, the methane content is no longer held constant, but cyclically changed as follows:

| Operating mode 1 (high over-saturation): | | |
| --- | --- | --- |
| $CH_4$ content | Vol. % | 2 |
| duration per operating mode | s | 10 |
| Operating mode 2 (lower over-saturation): | | |
| $CH_4$ content | Vol. % | 0.5 |
| duration per operating mode | s | 20 |
| period duration | s | 30 |

By changing the methane flow, depending on the method and the system, the other values are also slightly modulated. The overall growth rate can also change a little. In the second example chosen, for example, it rises from 0.25 μm/h to about 0.3 μm/h.

Again, the result is a nano-crystalline layer (FIGS. 6, 7).

Layers Produced

Figure 8:
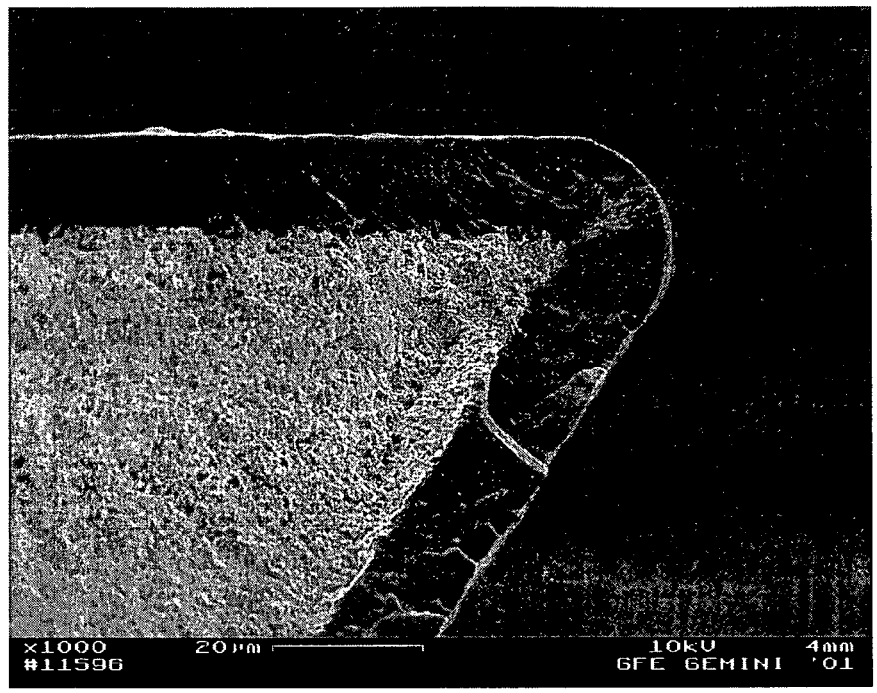
FIG. 8 is a scanning electron microscope image of a fracture of a nano-crystalline diamond layer on a hard metal cutting edge.

The diamond layers produced with the present method are shown in FIGS. 6-8. As can be seen, the layers, at the enlargement of 1000 times, do not show a structure, in particular a columnar structure.

The levelling effect can be clearly seen in FIG. 7. The substrate surface shown (cemented carbide) is relatively rough. The diamond layer deposited on it shows a reduced roughness at its surface, which can be seen in the fracture image of FIG. 7 without explicit measurements.

The mean roughness depth $R_z$, is used as the value for the surface roughness. A measuring standard is prescribed in DIN 4768. Approximately, $R_z$, can be equated to the difference between elevations and recesses and can therefore be directly taken from the fracture image (FIG. 7).

In the example of FIG. 7 there is a typical $R_z$ value at the interface, i.e. the substrate surface, of 3.8 μm. The surface roughness of the diamond layer, which is at about $R_z=1.4$ μm, is substantially smaller. The layer in the example shown is about 20 μm thick.

The preferred layers show a pronounced levelling effect. In contrast to conventional layers, in which the roughness increased as the layer grew thicker, in the present case, the roughness is reduced as the layer gets thicker. In most cases, with industrial cemented carbide surfaces, it will be hard to achieve residual roughnesses Rz of less than about 0.5 μm.

Increasing the Fracture Toughness

The layers produced with the discussed method have an increased fracture toughness. This decrease in the tendency to develop tears is first a consequence of a lack of long grain boundaries oriented on the substrate. Due to the great number of small crystals the tearing energy is distributed. The random orientation of the single crystals ensures that there is always a great number of favourably oriented crystals to receive both shearing and normal forces. Should there be a tear point, it will always meet a stable {111} plane after a short distance.

MEMS—Micro Electro Mechanical Systems

One application of diamond coatings results from their ability to deliberately form micro-structures. In such structures, the properties of the diamond as a sensor material and, depending on the doping, as an electronic component (conductor, isolator, dielectric) can also be utilized. For these systems, the term "MEMS devices" is often used (Micro Electro Mechanical Systems). The structures are usually subsequently etched into the layer by various methods.

For such systems, the conventional CVD diamond is hardly useful. Because of the small size of these structures in the μm and sometimes in the nm range (edge formation) it is advantageous to have the smallest possible crystallites in the base material in order to avoid anisotropy effects. This is why the present nano-crystalline diamond layers are particularly suitable.

Other Topics

Doping the layers can be carried out as in conventional methods, by introducing the doping gas at a constant or pulsed flow rate, for example together with the carbon carrier gas.

Multi-layer structures made with conventional methods or with the present method and refined to various degrees can considerably widen the functional range of tools, cutting edges, components and MEMS, in particular since the layers can also be doped in different ways. The individual layers of the multi-layer system are thus differentiated with respect to their etchability (for the production of MEMS), electric and thermal conductivity, electron emission, modulus of elasticity, hardness, thermal expansion, optical transmission etc.

While the above examples show hot filament methods, the principle used can also be applied to other CVD diamond coating methods.

The invention claimed is:

1. Method for CVD coating, comprising a coating procedure under a carbon-containing gas atmosphere, wherein a diamond layer is deposited directly on a substrate made out of cemented carbide or silicon, wherein during said coating procedure, process parameters are varied such that said parameters are changed multiple times between a first and a second operating state, wherein in said first operating state there is a higher carbon over-saturation of said carbon-containing atmosphere close to said substrate, and in said second operating state there is a lower over-saturation of said carbon-containing atmosphere close to said substrate, wherein the change between the two operating states is effected such that during the time in which the layer grows by 1 μm, at least 200 alternations are carried out between the operating states for depositing a nanocrystalline diamond layer on said substrate, wherein the surface of said layer has a surface roughness Rz which is less than the surface roughness Rz of said substrate surface.

2. The method according to claim 1, wherein during the time in which the layer grows by 1 μm, at least 500 alternations are carried out between the operating states.

3. The method according to claim 1, wherein the first and the second operating states are applied each for no more than 50 seconds.

4. The method according to claim 1, wherein the duration of the first and second operating state is selected such that the quotient of the time durations is between 0.5 and 2.

5. The method according to claim 1, wherein in the second operating state a process gas temperature is higher than in a first operating state.

6. The method according to claim 1, wherein in the first operating state the coating atmosphere has a higher effective carbon content than in the second operating state.

7. The method according to claim 1, wherein in the first operating state the coating atmosphere has a lower oxygen content than in the second operating state.

* * * * *